United States Patent
Isaka et al.

(10) Patent No.: US 11,965,235 B2
(45) Date of Patent: *Apr. 23, 2024

(54) COATED CUTTING TOOL

(71) Applicant: MOLDINO Tool Engineering, Ltd., Tokyo (JP)

(72) Inventors: Masakazu Isaka, Narita (JP); Ryotaro Fuwa, Narita (JP)

(73) Assignee: MOLDINO TOOL ENGINEERING, LTD., Tokyo (JP)

( * ) Notice: Subject to any disclaimer, the term of this patent is extended or adjusted under 35 U.S.C. 154(b) by 169 days.

This patent is subject to a terminal disclaimer.

(21) Appl. No.: 17/604,506

(22) PCT Filed: Apr. 27, 2020

(86) PCT No.: PCT/JP2020/017962
§ 371 (c)(1),
(2) Date: Oct. 18, 2021

(87) PCT Pub. No.: WO2020/226088
PCT Pub. Date: Nov. 12, 2020

(65) Prior Publication Data
US 2022/0213589 A1 Jul. 7, 2022

(30) Foreign Application Priority Data
May 9, 2019 (JP) ................... 2019-089303

(51) Int. Cl.
*C23C 14/06* (2006.01)
*C23C 14/00* (2006.01)
*C23C 14/32* (2006.01)

(52) U.S. Cl.
CPC ...... *C23C 14/0664* (2013.01); *C23C 14/0021* (2013.01); *C23C 14/0641* (2013.01); *C23C 14/325* (2013.01)

(58) Field of Classification Search
None
See application file for complete search history.

(56) References Cited

U.S. PATENT DOCUMENTS

| 11,052,464 B2 * | 7/2021 | Isaka | C23C 28/42 |
| 11,666,976 B2 * | 6/2023 | Isaka | C23C 28/044 |
| | | | 428/697 |

(Continued)

FOREIGN PATENT DOCUMENTS

| CN | 102459688 A | 5/2012 |
| CN | 103586520 A | 2/2014 |

(Continued)

OTHER PUBLICATIONS

Supplementary European Search Report dated Aug. 1, 2022, issued for European Patent Application No. 20802550.2.

(Continued)

*Primary Examiner* — Seth Dumbris
(74) *Attorney, Agent, or Firm* — Locke Lord LLP; James E. Armstrong, IV; Nicholas J. DiCeglie, Jr.

(57) ABSTRACT

Provided is a coated cutting tool, which includes a hard coating film containing a layer (b) formed of a nitride or a carbonitride, a layer (c) which is a layered coating film formed by alternately layering a nitride or carbonitride layer (c1) that contains 55 atom % or more of Al, Cr having a second highest content percentage, and at least B and a nitride or carbonitride layer (c2) that contains 55 atom % or more of Al and Ti having a second highest content percentage, each layer having a film thickness of 50 nm or less. A peak intensity Ih ascribable to a hcp (010) plane of AlN in the layer (c) and the total peak intensity Is ascribable to a plurality of predetermined crystal phases satisfy a relationship of $Ih \times 100/Is \leq 15$.

1 Claim, 1 Drawing Sheet

(56) References Cited

U.S. PATENT DOCUMENTS

| | | |
|---|---|---|
| 2007/0269610 A1 | 11/2007 | Fukui et al. |
| 2011/0183131 A1 | 7/2011 | Maeda et al. |
| 2017/0096733 A1 | 4/2017 | Sasaki et al. |
| 2018/0099335 A1* | 4/2018 | Takeshita ............ C23C 14/0641 |
| 2018/0326501 A1 | 11/2018 | Ogami et al. |
| 2019/0030614 A1 | 1/2019 | Katagiri |
| 2019/0111495 A1* | 4/2019 | Maekawa ........... C23C 14/0641 |
| 2020/0376567 A1 | 12/2020 | Isaka |
| 2022/0072622 A1 | 3/2022 | Isaka et al. |
| 2022/0143711 A1 | 5/2022 | Isaka |

FOREIGN PATENT DOCUMENTS

| | | | |
|---|---|---|---|
| CN | 103764873 | A | 4/2014 |
| CN | 108349015 | A | 7/2018 |
| CN | 109304489 | A | 2/2019 |
| EP | 3120955 | A1 | 1/2017 |
| EP | 3342512 | A1 | 7/2018 |
| JP | 2000-334606 | A | 12/2000 |
| JP | 2004-306228 | A | 11/2004 |
| JP | 2006-152321 | A | 6/2006 |
| JP | 2006-299399 | A | 11/2006 |
| JP | 2006-342414 | A | 12/2006 |
| JP | 2008-080447 | A | 4/2008 |
| JP | 2008-155328 | A | 7/2008 |
| JP | 2008-155329 | A | 7/2008 |
| JP | 2009-101491 | A | 5/2009 |
| JP | 2010-504439 | A | 2/2010 |
| JP | 2010-521589 | A | 6/2010 |
| JP | 2011-011286 | A | 1/2011 |
| JP | 2011-011287 | A | 1/2011 |
| JP | 2011-025405 | A | 2/2011 |
| JP | 2012-035378 | A | 2/2012 |
| JP | 2012-233260 | A | 11/2012 |
| JP | 2013-518987 | A | 5/2013 |
| JP | 2013-233652 | A | 11/2013 |
| JP | 2014-076500 | A | 5/2014 |
| JP | 2015-037834 | A | 2/2015 |
| JP | 5673904 | B1 | 2/2015 |
| JP | 2016-64487 | A | 4/2016 |
| JP | 2016-124086 | A | 7/2016 |
| JP | 5979438 | B2 | 8/2016 |
| JP | 2017-001147 | A | 1/2017 |
| JP | 2017-159445 | A | 9/2017 |
| JP | 2019-025591 | A | 2/2019 |
| TW | M545139 | U | 7/2017 |
| WO | 2008/037556 | A2 | 4/2008 |
| WO | 2008/116728 | A2 | 10/2008 |
| WO | 2010/150411 | A1 | 12/2010 |
| WO | 2011/095292 | A1 | 8/2011 |
| WO | 2013/081232 | A1 | 6/2013 |
| WO | 2014/157688 | A1 | 10/2014 |
| WO | 2015/141743 | A1 | 9/2015 |
| WO | 2016/013645 | A1 | 1/2016 |
| WO | 2017/073653 | A1 | 5/2017 |
| WO | 2017/090540 | A1 | 6/2017 |
| WO | 2017/159731 | A1 | 9/2017 |
| WO | 2018/221355 | A1 | 12/2018 |
| WO | 2019/098363 | A1 | 5/2019 |
| WO | 2020/189252 | A1 | 9/2020 |
| WO | 2020/189256 | A1 | 9/2020 |

OTHER PUBLICATIONS

Notice of Allowance dated Jan. 25, 2022, issued for Japanese Patent Application No. 2021-518359 and English translation thereof.
International Search Report dated Jul. 28, 2020, issued for PCT/JP2020/017962 and English translation thereof.
International Search Report dated Feb. 12, 2019, issued for PCT/JP2018/042653 and English translation thereof.
International Preliminary Report on Patentability dated Jul. 16, 2019, issued for PCT/JP2018/042653 and English translation thereof.
Supplementary European Search Report dated Mar. 17, 2021, issued for European Patent Application No. 18877499.6.
International Search Report dated Jun. 2, 2020, issued for PCT/JP2020/008846 and English translation thereof.
Supplementary European Search Report dated Jun. 10, 2022, issued for European Patent Application No. 20772556.5.
Office Action dated Nov. 8, 2022, issued for Japanese Patent Application No. 2021-507160 and English translation thereof.
Office Action (with partial translation of search report) issued in Chinese Patent Application No. CN 202080032044.6, mailed Jan. 29, 2024.

* cited by examiner

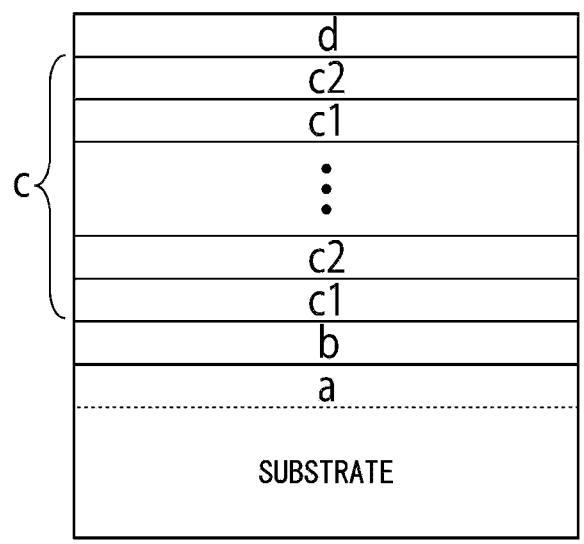

COATED CUTTING TOOL

TECHNICAL FIELD

The present invention relates to a coated cutting tool.
Priority is claimed on Japanese Patent Application No. 2019-089303, filed in Japan on May 9, 2019, the content of which is incorporated herein by reference.

BACKGROUND ART

Conventionally, as technology for improving the lifespan of a cutting tool, surface treatment technology for coating a surface of the cutting tool with a hard coating film formed of various ceramics is adopted. Among the hard coating films, a nitride mainly composed of Al and Cr is a type of film having excellent wear resistance and heat resistance and is widely applied to coated cutting tools.

For instance, Patent Document 1 discloses a coated cutting tool provided with a hard coating obtained by adding at least one of B, W, Mo, Ta, and Nb to a nitride of Al and Cr. Further, Patent Document 2 discloses a coated cutting tool provided with a hard coating in which AlCrB nitride layers and TiAl nitride layers are alternately laminated.

CITATION LIST

Patent Documents

[Patent Document 1]
Japanese Translation of PCT International Application Publication No. JP-T-2010-504439
[Patent Document 2]
Japanese Translation of PCT International Application Publication No. JP-T-2013-518987

SUMMARY OF INVENTION

Technical Problem

According to studies of the inventors of the present invention, it was ascertained that, in a coated cutting tool provided with AlCr-based nitride, which has been conventionally proposed, there is room for improvement in durability.

Solution to Problem

An aspect of the present invention provides a coated cutting tool that includes
  a substrate and a hard coating film formed on the substrate,
  in which the hard coating film has a layer (b) disposed on the substrate and composed of a nitride or a carbonitride, and
  a layer (c) that is disposed on the layer (b) and is a layered coating film formed by alternately layering a nitride or carbonitride layer (c1) that contains, with respect to a total amount of metal elements (including metalloid elements), 55 atom % or more of aluminum (Al), chromium (Cr) having a second highest content percentage, and at least boron (B) and a nitride or carbonitride layer (c2) that contains, with respect to the total amount of the metal elements (including metalloid elements), 55 atom % or more of aluminum (Al) and titanium (Ti) having a second highest content percentage, each layer having a film thickness of 50 nm or less, and
  in a case where, in an intensity profile obtained from a selected area diffraction pattern of a transmission electron microscope, a peak intensity ascribable to a (010) plane of AlN having a hexagonal closest packed structure is defined as Ih, and a sum of a peak intensity ascribable to a (111) plane of AlN, a (111) plane of TiN, a (111) plane of CrN, a (200) plane of AlN, a (200) plane of TiN, a (200) plane of CrN, a (220) plane of AlN, a (220) plane of TiN, and a (220) plane of CrN, all of which have a face-centered cubic structure, and a peak intensity ascribable to the (010) plane of AlN, a (011) plane of AlN, and a (110) plane of AlN, all of which have a hexagonal closest packed structure, is defined as Is, the layer (c) satisfies a relationship of Ih×100/Is≤15.

In addition, it is preferable that, a layer formed of a nitride or carbonitride containing Ti and Si is provided on the layer (c).

In addition, it is preferable that, a layer formed of an AlCr-based nitride or carbonitride, or a layer formed of an AlTi-based nitride or carbonitride is provided on the layer (c).

In addition, it is preferable that, with respect to a total film thickness of the hard coating film, the layer (c) is a thickest film.

In addition, it is preferable that the layer (c) is composed of columnar particles and an average width of the columnar particles is 90 nm or less.

Advantageous Effects of Invention

According to the present invention, a coated cutting tool having excellent durability can be provided.

BRIEF DESCRIPTION OF DRAWINGS

FIG. 1 is a view showing a cross-sectional structure of a coated cutting tool of an embodiment.

DESCRIPTION OF EMBODIMENTS

The inventors of the present invention studied a method for improving the tool lifespan in a coated cutting tool provided with an AlCrB-based nitride or carbonitride. The inventors of the present invention found that, when a layered coating film in which an Al-rich AlCr-based nitride or carbonitride (which may hereinafter be described as AlCrN-based) and an Al-rich AlTi-based nitride or carbonitride (which may hereinafter be described as AlTiN-based) are alternately layered at a nanolevel is provided, furthermore, the amount of AlN having an hcp structure that is contained in the microstructure of the layered coating film is reduced, a coated cutting tool exhibits more excellent durability and thus achieved the present invention. Hereinafter, details of the present embodiment will be described.

A coated cutting tool of the present embodiment has, for instance, a cross-sectional structure shown in FIG. 1. The coated cutting tool of the present embodiment has a substrate and a hard coating film formed on the substrate. The hard coating film has, from a substrate side in order, a layer (a) provided as needed, a layer (b) formed of a nitride or a carbonitride, a layer (c) formed of a layered coating film, and a layer (d) that is an upper layer provided as needed. Hereinafter, each layer will be described in detail.

<<Substrate>>

In the coated cutting tool of the present embodiment, the substrate is not particularly limited, but a WC-Co-based cemented carbide having excellent strength and toughness is preferably used as the substrate.

<<Layer (b)>>

The layer (b) according to the present embodiment is a nitride or carbonitride disposed on the substrate. The layer (b) is an underlaid layer that enhances adhesion between the substrate and the layer (c), which is a layered coating film. Since the layer (b) disposed on the substrate is a nitride or a carbonitride, the coated cutting tool becomes excellent in terms of adhesion between the substrate and the hard coating film. The layer (b) preferably contains 55 atom % or more of Al with respect to the total amount of metal elements (including metalloid elements; the same applies below). Furthermore, the amount of Al in the layer (b) is preferably 60 atom % or more. The layer (b) is set to be rich in Al, and thereby a difference in composition between the layer (b) and the layer (c) formed of an Al-rich layered coating film (to be described below) is reduced, and adhesion is improved. Furthermore, the layer (b) is set to be rich in Al, and thereby heat resistance is enhanced in the entire hard coating film. Furthermore, the layer (b) is preferably a nitride having excellent heat resistance and wear resistance. However, if the content percentage of Al of the layer (b) becomes too high, the amount of AlN having a brittle hcp structure is increased. For that reason, the amount of Al in the layer (b) is preferably 75 atom % or less. Furthermore, to further enhance the adhesion to the layer (c), which is a layered coating film, the layer (b) preferably contains metal elements which the layer (c1) or the layer (c2) (to be described below) contains. Furthermore, a peak intensity ascribable to an fcc structure in an intensity profile obtained from X-ray diffraction or a selected area diffraction pattern of a transmission electron microscope preferably shows the maximum in the layer (b). Thus, the amount of AlN having a brittle hcp structure contained in the microstructure of the layer (c) is reduced in the layer (c), which is an Al-rich layered coating film provided on the layer (b), and thereby the durability of the coated cutting tool is improved. As long as the layer (b) is a nitride or a carbonitride, the layer (b) may be composed of a plurality of layers having different compositions.

If the film thickness of the layer (b) becomes too thin, the adhesion to the substrate or the layer (c) is likely to deteriorate. On the other hand, if the film thickness of the layer (b) becomes too thick, chipping is likely to occur. In order for the coated cutting tool to realize more excellent durability, the film thickness of the layer (b) is preferably 0.1 µm or more and 5.0 µm or less. Furthermore, the film thickness of the layer (b) is preferably 0.2 µm or more. Furthermore, the film thickness of the layer (b) is preferably 3.0 µm or less. The upper and lower limit values of the film thickness of the layer (b) can be appropriately combined.

<<Layer (c)>>

The layer (c) according to the present embodiment is an Al-rich layered coating film that is provided between the layer (b) that is the aforementioned underlaid layer and the layer (d) (to be described below).

To be specific, the layer (c) is a layered coating film formed by alternately layering a nitride or carbonitride layer (c1) that contains, with respect to the total amount of the metal elements (including metalloid elements), 55 atom % or more of aluminum (Al), chromium (Cr) having a second highest content percentage, and, furthermore, at least boron (B) and a nitride or carbonitride layer (c2) that contains, with respect to the total amount of the metal elements (including metalloid elements), 55 atom % or more of aluminum (Al) and titanium (Ti) having a second highest content, each layer having a film thickness of 50 nm or less.

Furthermore, the layer (c) is preferably a layered coating film formed by alternately layering a nitride or carbonitride layer (c1) that contains, with respect to the total amount of the metal elements, 55 atom % or more of aluminum (Al), 20 atom % or more of chromium (Cr), and 1 atom % or more of boron (B) and a nitride or carbonitride layer (c2) that contains, with respect to the total amount of the metal portions, 55 atom % or more of aluminum (Al) and 20 atom % or more of titanium (Ti), each layer having a film thickness of 50 nm or less. The Al-rich AlCrN-based hard coating film and the Al-rich AlTiN-based hard coating film, which are different in composition system from each other, are alternately layered at a nanolevel, and thereby it becomes easy to curb the progress of coating film breakdown. Furthermore, it becomes difficult to contain AlN having an hcp structure in the layer (c), heat resistance is enhanced in the entire hard coating film, and the durability of the coated cutting tool is improved.

In an average composition of the layer (c), the content percentage of Al is preferably 55 atom % or more and 75 atom % or less, and the content percentage of Al is more preferably 73 atom % or less. Furthermore, in the average composition of the layer (c), the content percentage of Al is preferably 60 atom % or more and 70 atom % or less. Furthermore, in the average composition of the layer (c), the total content rate of Cr and Ti is preferably 20 atom % or more and 40 atom % or less. In addition, in the average composition of the layer (c), the content percentage of B is preferably 0.5 atom % or more and 5 atom % or less. Furthermore, in the average composition of the layer (c), the content percentage of B is preferably 1 atom % or more and 3 atom % or less. The average composition of the layer (c) may be calculated by measuring a range of 500 nm×500 nm or more.

Furthermore, the amount of AlN having an hcp structure contained in the microstructure needs to be small in the layer (c). The inventors of the present invention found that, even in a case where a peak intensity of AlN having an hcp structure is not ascertained through X-ray diffraction in an evaluation of the layer (c), AlN having a brittle hcp structure may be contained in the microstructure. In addition, the inventors of the present invention ascertained that the durability of the coated cutting tool is improved by reducing the amount of AlN having a brittle hcp structure contained in the microstructure of the layer (c).

To quantitatively evaluate the amount of AlN having a hcp structure that is present in the microstructure of the hard coating film, a selected area diffraction pattern is obtained from a machined cross section of the hard coating film using a transmission electron microscope, and an intensity profile obtained from the selected area diffraction pattern is used. To be specific, a relationship of Ih×100/Is is evaluated in the intensity profile of the selected area diffraction pattern of the transmission electron microscope. Ih and Is are defined as follows.

Ih: A peak intensity ascribable to a (010) plane of AlN having an hcp structure.

Is: The sum of a peak intensity ascribable to a (111) plane of AlN, a (111) plane of TiN, a (111) plane of CrN, a (200) plane of AlN, a (200) plane of TiN, a (200) plane of CrN, a (220) plane of AlN, a (220) plane of TiN, and a (220) plane of CrN, all of which have an fcc structure, and a peak intensity ascribable to a (010) plane of AlN, a (011) plane of AlN, and a (110) plane of AlN, all of which have an hcp structure.

By evaluating the relationship between Ih and Is, AlN having an hcp structure contained in the microstructure can be quantitatively evaluated in the hard coating film in which the peak intensity ascribable to AlN having an hcp structure is not ascertained by X-ray diffraction. A smaller value of Ih×100/Is means that the amount of AlN having a brittle hcp structure that is present in the microstructure of the layer (c) is smaller. The inventors of the present invention ascertained that, in a case where the value of Ih×100/Is in the layer (c) is greater than 15, the durability of the coated cutting tool is likely to deteriorate under severe usage environments. In the present embodiment, the layer (c) is configured to satisfy Ih×100/Is≤15, and thereby the coated cutting tool having favorable durability is realized. Furthermore, the coated cutting tool of the present embodiment preferably has a constitution in which the layer (c) satisfies Ih×100/Is≤10. Furthermore, the coated cutting tool of the present embodiment preferably has a constitution in which the layer (c) satisfies Ih×100/Is≤5. Furthermore, the coated cutting tool of the present embodiment preferably has a constitution in which the peak intensity ascribable to the (010) plane of AlN having an hcp structure is not ascertained in the layer (c), that is, a constitution in which the layer (c) satisfies Ih×100/Is=0. Even in a case where a diffraction pattern of AlN having an hcp structure is ascertained in the selected area diffraction pattern, if the amount of AlN is small, no peak appears in the intensity profile, and the value of Ih×100/Is may become zero (0). AlN having an hcp structure is preferably not ascertained in the selected area diffraction pattern of the layer (c) to further enhance the durability of the coated cutting tool.

<<Layer (c1)>>

The layer (c1) is a nitride or carbonitride that contains, with respect to the total amount of the metal elements (including metalloid elements), 55 atom % or more of aluminum (Al), chromium (Cr) having a second highest content percentage, and, furthermore, at least boron (B). Furthermore, the layer (c1) is preferably a nitride or carbonitride that contains, with respect to the total amount of the metal elements, 55 atom % or more of aluminum (Al), 20 atom % or more of chromium (Cr), and 1 atom % or more of boron (B).

A nitride or carbonitride based on Al and Cr is a type of film having excellent heat resistance. Especially, if the content percentage of Al is increased, the heat resistance of the hard coating film tends to improve, and the durability of the coated cutting tool is improved. Furthermore, the layer (c1) is preferably a nitride that is excellent in terms of heat resistance and wear resistance. To impart high heat resistance to the hard coating film, the layer (c1) contains 55 atom % or more of Al. Furthermore, the content percentage of Al of the layer (c1) is preferably 60 atom % or more. However, if the content percentage of Al becomes too high, the amount of AlN having a brittle hcp structure contained in the microstructure increases, and thus the durability of the hard coating film deteriorates. For that reason, the content percentage of Al of the layer (c1) is preferably set to 75 atom % or less. The content percentage of Al of the layer (c1) is preferably 73 atom % or less and more preferably 70 atom % or less.

If the content percentage of Cr becomes too low, the wear resistance of the nitride or carbonitride based on Al and Cr deteriorates. To impart high wear resistance to the hard coating film, the layer (c1) preferably contains 20 atom % or more of Cr. In order to form the layer (c1) as an AlCr-based nitride or carbonitride, the layer (c1) contains Cr at a second highest content after Al. However, if the content percentage of Cr in the layer (c1) becomes too high, the content percentage of Al is relatively lowered, and thus the heat resistance deteriorates. For that reason, the content percentage of Cr of the layer (c1) is preferably 40 atom % or less and more preferably 35 atom % or less.

To further enhance the heat resistance and wear resistance of the layered coating film, the total content percentage of Al and Cr of the layer (c1) is preferably 85 atom % or more with respect to the total amount of the metal elements (including metalloid elements).

Since the nitride or carbonitride of Al and Cr contains the element B, the coating film structure becomes fine, and the wear resistance is further improved. In addition, by forming BN in the coating film, the lubricity is improved. For that reason, the layer (c1) contains B, which improves the wear resistance and the lubricity of the entire layered coating film. To sufficiently exhibit the effect of B addition, the layer (c1) preferably contains 1 atom % or more of B. However, if the content percentage of B becomes too high, the amount of AlN having an hcp structure or an amorphous phase that is contained in the microstructure increases, and thus the durability deteriorates. For that reason, the content percentage of B of the layer (c1) is preferably 5 atom % or less and more preferably 3 atom % or less.

Since the layer (c1) and the layer (c2) are alternately layered at a nanolevel, the mutual compositions are mixed at the time of coating the layer (c1) and the layer (c2). Furthermore, the mutual compositions can be diffused. For that reason, the layer (c1) can contain Ti that is essentially contained in the layer (c2). However, in order to layer the Al-rich AlCrN-based hard coating film and the Al-rich AlTiN-based hard coating film that have different composition systems, the content percentage of Ti of the layer (c1) is set to be lower than the content percentage of Ti of the layer (c2).

The layer (c1) can contain metal elements other than Al, Cr, and B. The layer (c1) can contain, for instance, one or two or more elements selected from elements of Group IVa, Group Va, and Group VIa of the periodic table, Si and Y for the purpose of improving the wear resistance, heat resistance, lubricity, or the like of the hard coating film. To improve the properties of the hard coating film, these elements are elements that are generally added to AlTiN-based or AlCrN-based hard coating films and do not remarkably degrade the durability of the coated cutting tool as long as the content percentage thereof does not become excessive.

However, if the layer (c1) contains a large amount of the metal elements other than Al, Cr, and B, basic properties as the AlCrN-based hard coating film are damaged, and the durability of the coated cutting tool deteriorates. For that reason, the sum of the metal elements other than Al, Cr, and B in the layer (c1) is 25 atom % or less, preferably 20 atom % or less, and more preferably 15 atom % or less with respect to the total amount of the metal elements (including metalloid elements).

<<Layer (c2)>>

The layer (c2) is a nitride or carbonitride that contains, with respect to the total amount of the metal elements (including metalloid elements), 55 atom % or more of aluminum (Al) and titanium (Ti) having a second highest content. Furthermore, the layer (c2) is preferably a nitride or carbonitride that contains, with respect to the total amount of the metal elements, 55 atom % or more of aluminum (Al)

and 20 atom % or more of titanium (Ti). The nitride or carbonitride mainly composed of Al and Ti is a type of film having excellent wear resistance and heat resistance. Especially, if the content percentage of Al is increased, the heat resistance of the hard coating film tends to improve, and the durability of the coated cutting tool is improved. Furthermore, the layer (c2) is preferably a nitride having excellent heat resistance and wear resistance. To impart high heat resistance to the hard coating film, the layer (c2) contains 55 atom % or more of Al. Furthermore, the amount of Al in the layer (c2) is preferably 60 atom % or more. However, if the content percentage of Al becomes too high, the amount of AlN having an hcp structure increases, and thus the durability of the hard coating film deteriorates. For that reason, the content percentage of Al of the layer (c2) is preferably set to 75 atom % or less. The content percentage of Al of the layer (c2) is preferably 73 atom % or less and more preferably 70 atom % or less.

If the content percentage of Ti becomes too low, the wear resistance of the nitride or carbonitride based on Al and Ti deteriorates. For that reason, the layer (c2) preferably contains 20 atom % or more of Ti. In order to form the layer (c2) as an AlTi-based nitride or carbonitride, the layer (c2) contains Ti at a second highest content after Al. However, if the content percentage of Ti becomes too high, the content percentage of Al is relatively lowered, and thus the heat resistance deteriorates. For that reason, the content percentage of Ti of the layer (c2) is preferably 40 atom % or less and more preferably 35 atom % or less.

To further enhance the heat resistance and wear resistance of the layered coating film, the total content percentage of Al and Ti of the layer (c2) is preferably 80 atom % or more with respect to the total amount of the metal elements (including metalloid elements).

Since the layer (c1) and the layer (c2) are alternately layered at a nanolevel, the mutual compositions are mixed at the time of coating the layer (c1) and the layer (c2). Furthermore, the mutual compositions can be diffused. For that reason, the layer (c2) can contain Cr and B that are essentially contained in the layer (c1). However, to layer the Al-rich AlCrN-based hard coating film and the Al-rich AlTiN-based hard coating film that have different composition systems, the content percentage of Cr of the layer (c2) is set to be lower than the content percentage of Cr of the layer (c1). The layer (c2) may not contain B the content percentage of which is low in the layer (c1).

The layer (c2) can contain metal elements other than Al and Ti. The layer (c2) can contain, for instance, one or two or more elements selected from elements of Group IVa, Group Va, and Group VIa of the periodic table, Si, B, and Y for the purpose of improving the wear resistance, heat resistance, lubricity, or the like of the hard coating film. To improve the properties of the hard coating film, these elements are elements that are generally added to AlTiN-based or AlCrN-based hard coating films and do not remarkably degrade the durability of the coated cutting tool as long as the content percentage thereof does not become excessive. Especially, the AlTiN-based hard coating film preferably contains a tungsten (W) element since the durability tends to be excellent even under severer usage environments.

However, if the layer (c2) contains a large amount of the metal elements other than Al and Ti, basic properties as the AlTiN-based hard coating film are damaged, and the durability of the coated cutting tool deteriorates. For that reason, the sum of the metal elements other than Al and Ti in the layer (c2) is 25 atom % or less, preferably 20 atom % or less, and more preferably 15 atom % or less with respect to the total amount of the metal elements (including metalloid elements).

To further enhance adhesion between the layer (b), which is an underlaid layer, and the layer (c), which is a layered coating film, a hard coating film having the same composition system as the layer (b) is preferably a thicker film at a portion of the layer (c) which is located close to the layer (b). To be specific, if the layer (b) is an AlCrN-based hard coating film, the layer (c1) is preferably a film thicker than the layer (c2) at a portion of the layer (c) which is located close to the layer (b). Furthermore, if the layer (b) is an AlTiN-based hard coating film, the layer (c2) is preferably a film thicker than the layer (c1) at a portion of the layer (c) which is located close to the layer (b). This coating film structure tends to enhance the adhesion between the layer (b), which is an underlaid layer, and the layer (c), which is a layered coating film, and the durability of the coated cutting tool may be further improved depending on the tool shape or usage environments.

In the present embodiment, the layer (c) is preferably a thickest film with respect to the total film thickness of the hard coating film. Since the layer (c) is the main layer of the hard coating film, the adhesion and the wear resistance are both satisfied at a high level, and the durability of the coated cutting tool is improved.

Optimum film thicknesses of the layers vary according to the type of the tool, the diameter of the tool, a material to be cut, or the like; however, in any case, the layer (c) becomes the thickest film, and thereby excellent durability is likely to be realized. In addition, in a case where the total film thickness of the layer (b), the layer (c), and the layer (d) is defined as 100%, the film thickness ratio of the layer (c) is preferably 50% or more, more preferably 60% or more, and still more preferably 70% or more. However, if the film thickness ratio of the layer (c) becomes too large, the film thicknesses of the layer (b) and the layer (d) become small, and thus the adhesion or the wear resistance deteriorates. For that reason, the film thickness ratio of the layer (c) is preferably 90% or less and more preferably 85% or less.

The film thickness ratio of the layer (b) is preferably 5% or more. The film thickness ratio of the layer (d) is preferably 10% or more.

To enhance the adhesion of the layered coating film, the film thickness of each of the layer (c1) and the layer (c2) is preferably 20 nm or less. Furthermore, if the film thickness of each of the layer (c1) and the layer (c2) is excessively small, it becomes difficult to form the layered coating film having different composition systems, and thus the film thickness of each of the layer (c1) and the layer (c2) is preferably 2 nm or more. Furthermore, the film thickness of each of the layer (c1) and the layer (c2) is preferably 5 nm or more. The upper and lower limit values of the film thickness of the layer (c1) and the upper and lower limit values of the film thickness of the layer (c2) can be appropriately combined.

<<Layer (d)>>

In the present embodiment, as necessary, a layer (d) may be provided as a protective film on the upper layer of the layer (c), which is a layered coating film. For instance, as the layer (d), a nitride or carbonitride that contains Ti and Si having excellent wear resistance may be provided. In addition, as the layer (d), an AlCr-based nitride or carbonitride, or an AlTi-based nitride or carbonitride may be provided. Further, as the layer (d), a nitride or carbonitride having a composition other than TiSi-based composition, AlCr-based composition and AlTi-based composition may be provided.

Further, as the layer (d), a metal other than nitride or carbonitride, a carbide, a boride or the like may be provided.

The layer (b), the layer (c), and the layer (d) of the hard coating film according to the present embodiment are preferably a nitride that is excellent in terms of heat resistance and wear resistance. Since the entire hard coating film is a nitride, the durability of the coated cutting tool is further improved. Generally, even when the hard coating film is a nitride, the hard coating film contains a minute amount of oxygen and carbon. That is, a metal nitride has a peak intensity in which a metal element and oxygen or carbon are bonded in a microanalysis. If the hard coating film according to the present embodiment is mainly composed of a nitride, a carbonitride or an oxynitride may be contained in a part of the nitride. As long as the aforementioned composition and coating film structure are satisfied, the durability of the coated cutting tool is not remarkably degraded even when a carbonitride or an oxynitride is contained in a part of the nitride that composes the hard coating film. Even in a case where the hard coating film according to the present embodiment is composed of a carbonitride, the content percentage of nitrogen is preferably higher than the content percentage of carbon to further enhance the heat resistance and wear resistance of the hard coating film. Even in the case where the hard coating film is composed of a carbonitride, the content percentage of carbon is preferably set to 20 atom % or less and more preferably set to 10 atom % or less with respect to the content percentage of nitrogen.

<<Layer (a)>>

In the present embodiment, a layer (a) the nano-beam diffraction pattern of which is indexed to the crystal structure of WC may be provided between the substrate and the layer (b), which is an underlaid layer, as needed. The layer (a) is formed on a surface of the substrate by metal ion bombardment. Since the layer (a) is a layer formed by diffusion of metal elements used for the metal ion bombardment, in a case where a WC-Co-based cemented carbide is used as the substrate, the layer (a) contains, with respect to the total amount of the metal elements, tungsten (W) in a largest amount and the metal elements used for the metal ion bombardment in a second largest amount. Since the hard coating film has such a layer (a), adhesion between the substrate and the underlaid layer provided on the substrate tends to be remarkably improved.

However, if the diameter of the tool is reduced, a cutting edge may be damaged by fusion resulting from the metal ion bombardment in a square end mill or radius end mill in which the cutting edge is likely to become a sharp angle, and the ridge line of the cutting edge is likely to break. For that reason, the layer (a) is preferably provided in a ball end mill in which the ridge line of the cutting edge is not easily broken by metal ion bombardment and a sharp cutting edge is not formed. In a case where the film thickness of the layer (a) is too thin or too thick, an effect of improving the adhesion is not obtained. For that reason, the film thickness of the layer (a) is preferably 1 nm or more and 10 nm or less.

Since the layer (a) is a layer the nano-beam diffraction pattern of which is indexed to the crystal structure of WC, the layer (a) is mainly composed of a carbide. If the layer (a) is a layer the nano-beam diffraction pattern of which is indexed to the crystal structure of WC, nitrogen or oxygen may be contained in a part of the layer (a). Furthermore, the layer (a) may partly contain a metal layer or a crystal phase having an fcc structure. Especially, a bombardment treatment using a metal Ti target or an alloy target that is mainly composed of Ti has a great effect of improving adhesion. For that reason, the layer (a) preferably contains, as the content percentage of a metal element, Ti at a second highest content percentage after W. However, if the content percentage of Ti contained in the layer (a) becomes too high or too low, the effect of improving adhesion is not easily obtained. The layer (a) preferably contains 10 atom % or more and 30 atom % or less of Ti.

According to the coated cutting tool of the present embodiment described above, the layer (c), which is a layered coating film of the layer (c1) formed of an AlCr-based hard coating film and the layer (c2) formed of an AlTi-based hard coating film and has a reduced amount of AlN having an hcp structure, is provided, and thereby it is possible to improve the heat resistance and the wear resistance compared with conventional AlCr-based hard coating films. Further, the coating film has the layer (c1) which contains B, and thereby the lubricity of the coating film is improved. Therefore, according to the present embodiment, a coated cutting tool having excellent durability is provided.

<<Producing Method>>

The hard coating film according to the present embodiment is preferably coated by an arc ion plating method in which the ionization rate of a target is high. Furthermore, the hard coating film may be coated by a high power sputtering method in which the ionization rate of a target is high. In addition, to enhance crystallinity in the Al-rich layered coating film and thereby reduce the amount of AlN having an hcp structure contained in the microstructure, a cathode in which the magnetic flux density near the center of the target in the vertical direction is 10 mT or higher is preferably used.

Furthermore, in a cathode for forming the AlCr-based hard coating film, the film is preferably formed at a cathode voltage within a range of 20 V or higher and 35 V or lower. If the cathode voltage is excessively low, the amount of AlN having an hcp structure in the layered coating film is increased, and the durability deteriorates. Furthermore, if the cathode voltage becomes too high, the coating film structure of the layered coating film becomes too coarse, and the durability is likely to deteriorate.

In a cathode for forming the AlTi-based hard coating film, the film is preferably formed at a cathode voltage within a range of 20 V or higher and 30 V or lower. If the cathode voltage becomes too low, the amount of AlN having an hcp structure in the layered coating film is increased, and the durability deteriorates. Furthermore, if the cathode voltage becomes too high, the coating film structure of the layered coating film becomes too coarse, and the durability is likely to deteriorate. Each cathode current is preferably 120 A or higher and 200 A or lower.

In the producing method of the present embodiment, after a film forming apparatus in which the magnetic flux density in the vertical direction near the center of the target and the cathode voltage fall in the aforementioned ranges is selected, the absolute value of a negative bias voltage that is applied to the substrate is preferably increased. According to the producing method, generation of AlN having an hcp structure in the microstructure is curbed. Therefore, the value of $Ih \times 100/Is$ in the layer (c) can be made smaller than 15.

The negative bias voltage that is applied to the substrate is preferably −200 V or higher and lower than −100 V. Furthermore, the negative bias voltage is preferably −120 V or lower. If the absolute value of the bias voltage becomes too large, film formation is not easily stabilized, and it becomes difficult to adjust the film thickness. Furthermore, if the absolute value of the bias voltage becomes too small, the amount of AlN having an hcp structure in the layered coating film is increased, and the durability deteriorates. The coating temperature is preferably 400° C. or higher and 600° C. or lower. In a case where a nitride is coated, the nitride is coated by introducing a nitrogen gas into the vacuum container. Furthermore, the pressure of the nitrogen gas during coating is preferably 2.0 Pa or higher and 8.0 Pa or lower. In a case where a carbonitride is coated, some of the nitrogen gas may be substituted with a methane gas.

Examples

<Film Forming Apparatus>

A film forming apparatus using an arc ion plating method was used for film formation. The film forming apparatus includes a plurality of cathodes (arc evaporation sources), a vacuum container, and a substrate rotating mechanism. As the cathodes, one cathode (hereinafter referred to as "C1"), in which a coil magnet is disposed the outer circumference of a target, and three cathodes (hereinafter referred to as "C2, C3, and C4"), in which a permanent magnet is disposed on the back surface and the outer circumference of a target, a magnetic flux density in the vertical direction is present on the front surface of the target, and the magnetic flux density in the vertical direction is 14 mT near the center of the target, are mounted. C1 to C4 are disposed around a region in which the substrates are disposed at intervals of about 90°, and C1 and C4, and C2 and C3 are provided to face each other.

The inside of the vacuum container is exhausted with a vacuum pump, and a gas is introduced from a supply port. A bias power supply is connected to each substrate installed in the vacuum container, which makes it possible to apply a negative DC bias voltage to each substrate independently.

The substrate rotating mechanism includes a planetary, a plate-like jig disposed on the planetary, and a pipe-like jig disposed on the plate-like jig, the planetary rotates at a speed of 3 revolutions per minute, and the plate-like jig and the pipe-like jig are configured to rotate and revolve.

In Example, the following ball end mill was used for the substrates.

Composition: WC (bal.), Co (8 mass %), Cr (0.5 mass %), and V (0.3 mass %)

Hardness: 94.0 HRA

Blade diameter: 1 mm, number of blades: Two

A metal titanium target on C1, an AlTi-based alloy target on C2, an AlCrB-based alloy target on C3, and a AlCrB-based alloy target on C4 were installed, respectively. The compositions of the targets used are shown in Table 1.

TABLE 1

| Sample No. | C1 (atom %) | C2 (atom %) | C3 (atom %) | C4 (atom %) |
| --- | --- | --- | --- | --- |
| Example 1 | Ti100 | Al70Ti25W5 | Al60Cr30B10 | Al60Cr30B10 |
| Comparative Example 1 | Ti100 | Al70Ti25W5 | Al60Cr30B10 | Al60Cr30B10 |
| Comparative Example 2 | Ti100 | Al55Ti45 | Al60Cr30B10 | Al60Cr30B10 |

Each substrate was fixed to the pipe-like jig in the vacuum container, and the following process was performed before film formation. First, the inside of the vacuum container was vacuum-exhausted to $5 \times 10^{-2}$ Pa or lower. Afterward, the substrate was heated up to a temperature of 500° C. with a heater installed in the vacuum container, and the vacuum container was vacuum-exhausted. In addition, the set temperature for the substrate was set to 500° C., and the pressure inside the vacuum container was set to $5 \times 10^{-2}$ Pa or lower.

<Ar Bombardment>

Afterward, an argon (Ar) gas was introduced into the vacuum container, and the pressure inside the vacuum container was set to about 0.67 Pa. Afterward, a current of 35 A was supplied to a filament electrode, a negative bias voltage of −200 V was applied to the substrate, and Ar bombardment was performed for 15 minutes.

<Ti Bombardment Step>

Afterward, the vacuum container was vacuum-exhausted such that the pressure inside the vacuum container reached $8 \times 10^{-3}$ Pa or lower. Subsequently, an arc current of 120 A was supplied to C1, a negative pressure bias voltage of −800 V was applied to the substrate, and a Ti bombardment treatment was performed for 15 minutes.

<Film Forming Process>

Afterward, the set temperature for the substrate was set to 480° C., and the pressure in the vacuum container was set to 3.2 Pa by introducing a nitrogen gas into the vacuum container.

During the coating of the layer (b), in all samples, the negative bias voltage applied to the substrates was set to −120 V, and the current applied to C2 was set to 200 A. The layer (b) was coated in a film thickness of about 0.5 μm.

During the coating of the layer (c), the negative bias voltage applied to the substrate was changed according to the sample. Furthermore, power supplied to C2 was fixed, power supplied to C3 was gradually increased, and a portion of the layer (c) which was close to the layer (b) was coated such that the thickness became thicker in the (AlTiN-based) layer (c2) than in the (AlCrN-based) layer (c1). During the coating, the cathode voltage of C2 was 20 V or higher and 30 V or lower, and the cathode voltage of C3 was 20 V or higher and 35 V or lower.

During the coating of the layer (d), in all samples, the negative bias voltage applied to the substrate was set to −120 V, and the current applied to C4 was set to 150 A. The layer (d) was coated in a film thickness of about 1.5 μm. Conditions for the film formation of the layer (c) are shown in Table 2.

TABLE 2

| | Layer (c1) | | Layer (c2) | |
| --- | --- | --- | --- | --- |
| Sample No. | Bias voltage (V) | Current (A) | Bias voltage (V) | Current (A) |
| Example 1 | −120 | 135 → 150 | −120 | 150 |
| Comparative Example 1 | −75 | 135 → 150 | −75 | 150 |
| Comparative Example 2 | −120 | 135 → 150 | −120 | 150 |

A cutting test was performed on the made coated cutting tool under cutting conditions shown below.

Results of the cutting test are shown in Table 3. Details of the cutting conditions are as follows.

<Machining Conditions>

Cutting method: Side cutting

Work piece: STAVAX (52 HRC)

Tool for use: Two-blade ball end mill (tool diameter of 1 mm)

Depth of cut: 0.04 mm in the axial direction, and 0.04 mm in the radial direction Main axis rotating speed: 24000 min$^{-1}$ Feed rate: 860 mm/min Coolant: Dry machining (air blow)

Cutting distance: 90 m

TABLE 3

| Sample No. | Maximum wear width (mm) |
|---|---|
| Example 1 | 0.018 |
| Comparative Example 1 | 0.026 |
| Comparative Example 2 | 0.037 |

Example 1 was in a state in which the maximum wear width was small, a stable wear form was exhibited, and continuous cutting machining was possible. Comparative Example 1 had the same coating film composition as in Example 1, but the maximum wear width became great. Comparative Example 2 had a composition in which the content percentage of Al of the layered coating film was lower than in the present example, and the maximum wear width become great.

A microanalysis of the layered coating film was performed on Example 1 in order to describe a cause of excellent durability.

A composition analysis was performed on the layer (b) and the layer (d) by an accessory wavelength dispersive spectrometry electron probe microanalysis (WDS-EPMA) using an electron probe micro-analyzer (model No. JXA-8500F) available from JEOL Ltd., and it was ascertained that the layer (b) and the layer (d) were a nitride that was nearly the same as the alloy composition of the target.

As to Example 1, the ball end mill for evaluating physical properties was machined, and a machined cross section was observed with a transmission electron microscope (TEM). It was ascertained that the layer (c), which was a layered coating film, was composed of fine columnar particles having an average width of 50 to 70 nm.

Examples of the results of the composition analysis of the entire layered coating film are shown in Table 4. The compositions of the layer (c1) and the layer (c2) were obtained by setting an analysis region to φ1 nm and analyzing a central portion of each layer using an energy dispersive X-ray spectrometer (EDS). The results were obtained by rounding off values below the decimal point.

The layer (c) of Example 1 was rich in Al in the entire layered coating film and contained at least B, Ti, and Cr. In Example 1, the compositions of the layer (c1) and the layer (c2) were mutually mixed, and the layer (c1) contained 10 atom % or less of Ti and W in total. Furthermore, the layer (c2) of Example 1 contained 10 atom % or less of Cr.

TABLE 4

| | Al (atom %) | B (atom %) | Ti (atom %) | Cr (atom %) | W (atom %) |
|---|---|---|---|---|---|
| Entire layered coating film | 64 | 2 | 12 | 19 | 3 |
| c1 | 65 | 1 | 6 | 27 | 1 |
| c2 | 65 | 0 | 25 | 4 | 6 |

Next, a selected area diffraction pattern of the layered coating film was obtained under conditions that an accelerating voltage was 120 kV, a selected area region was φ750 nm, a camera length was 100 cm, and a quantity of incident electrons was 5.0 pA/cm$^2$ (on a fluorescent plate). An intensity profile was obtained by converting the brightness of the obtained selected area diffraction pattern. A spot for analysis was an intermediate portion in a film thickness direction.

In Example 1, the peak ascribable to the AlN (010) having an hcp structure is not ascertained, and Ih×100/Is was zero (0). On the other hand, as a result of performing the same measurement as in Example 1 on the layer (c) of Comparative Example 1, there was a peak ascribable to AlN (010) having an hcp structure, and Ih×100/Is was 19.

As to Example 1 and Comparative Example 1, the peak intensity ascribable to AlN having an hcp structure was not ascertained by X-ray diffraction, but there was a difference in the peak intensity ascribable to AlN having an hcp structure in the selected area diffraction pattern. In Example 1, it is assumed that the durability was remarkably improved since the amount of AlN having an hcp structure contained in the microstructure was small.

What is claimed is:

1. A coated cutting tool comprising a substrate and a hard coating film formed on the substrate,
   wherein the hard coating film has:
   a layer (b) disposed on the substrate and composed of a nitride or a carbonitride, and
   a layer (c) that is disposed on the layer (b) and is a layered coating film formed by alternately layering
   a nitride or carbonitride layer (c1) that contains, with respect to a total amount of metal elements (including metalloid elements), 55 atom % or more of aluminum (Al), chromium (Cr) having a second highest content percentage, and at least boron (B);
   a nitride or carbonitride layer (c2) that contains, with respect to the total amount of the metal elements (including metalloid elements), 55 atom % or more of aluminum (Al) and titanium (Ti) having a second highest content percentage, each layer having a film thickness of 50 nm or less, and
   in a case where, in an intensity profile obtained from a selected area diffraction pattern of a transmission electron microscope, a peak intensity ascribable to a (010) plane of MN having a hexagonal closest packed structure is defined as Ih, and a sum of a peak intensity ascribable to a (111) plane of MN, a (111) plane of TiN, a (111) plane of CrN, a (200) plane of MN, a (200) plane of TiN, a (200) plane of CrN, a (220) plane of MN, a (220) plane of TiN, and a (220) plane of CrN, all of which have a face-centered cubic structure, and a peak intensity ascribable to the (010) plane of MN, a (011) plane of MN, and a (110) plane of MN, all of which have a hexagonal closest packed structure, is defined as Is, the layer (c) satisfies a relationship of Ih×100/Is≤15.

* * * * *